(12) United States Patent
Ladebeck et al.

(10) Patent No.: US 8,242,777 B2
(45) Date of Patent: Aug. 14, 2012

(54) CALIBRATION OF AN EMISSION TOMOGRAPHY SUBSYSTEM

(75) Inventors: Ralf Ladebeck, Erlangen (DE);
Johannes Pauli, Uttenreuth (DE);
Charles C. Watson, Knoxville, TN (US)

(73) Assignee: Siemens Aktiengesellschaft, Munich (DE)

( * ) Notice: Subject to any disclaimer, the term of this patent is extended or adjusted under 35 U.S.C. 154(b) by 410 days.

(21) Appl. No.: 12/585,871

(22) Filed: Sep. 28, 2009

(65) Prior Publication Data
US 2011/0074410 A1    Mar. 31, 2011

(51) Int. Cl.
*G01V 3/00*    (2006.01)
(52) U.S. Cl. ........................................ 324/307; 324/317
(58) Field of Classification Search ................... 324/307, 324/309, 317, 318, 322
See application file for complete search history.

(56) References Cited

U.S. PATENT DOCUMENTS

| 7,923,691 | B2 * | 4/2011 | Ladebeck ................ 250/363.04 |
| 2007/0102641 | A1 | 5/2007 | Schmand et al. |
| 2011/0158497 | A1 * | 6/2011 | Schweizer et al. ............ 382/131 |
| 2011/0309251 | A1 * | 12/2011 | Fenchel et al. ................ 250/362 |

OTHER PUBLICATIONS

Deming Wang et al.: "Geometric Distortion in Structural Magnetic Resonance Imaging", Current Medical Imaging Reviews, 2005, I, p. 49-60.
Schwaiger et al. "MR-PET: Combining Function, Anatomy, and More", 2005; DE.

* cited by examiner

*Primary Examiner* — Louis Arana
(74) *Attorney, Agent, or Firm* — Harness, Dickey & Pierce, P.L.C.

(57) ABSTRACT

A method and a system are disclosed for calibrating an emission tomography subsystem in a combined MR (magnetic resonance) and emission tomography imaging system. In at least one embodiment, the method includes providing a phantom that is configured such that the phantom is visible on a MR image, providing an attenuation map of the phantom, wherein the attenuation map includes an attenuation of the phantom, obtaining the MR image of the phantom, obtaining a position of the phantom from the MR image, mapping the attenuation map with the position of the phantom, and calibrating the emission tomography subsystem using the attenuation map mapped with the position of the phantom.

19 Claims, 4 Drawing Sheets

CALIBRATION OF AN EMISSION TOMOGRAPHY SUBSYSTEM

FIELD

At least one embodiment of the present invention generally relates to a method and/or a system for calibrating an emission tomography subsystem in a combined MR and emission tomography imaging system. Another aspect of at least one embodiment of the invention generally relates to tuning up of the emission tomography imaging system in the combined MR and emission tomography imaging system.

BACKGROUND

In an emission tomography system, photons from the inside of a body, or in case of system tune-up, from a phantom and the like, that is to be imaged are detected. These photons pass from the interior of the body to a detector outside the body and may be attenuated by different parts of the body, depending on the composition of the body.

In order to reconstruct a three-dimensional distribution of a radionuclide within the body or phantom accurately, this attenuation must be considered. Generally, the emission tomography may be a Positron Emission Tomography (PET), a Single Photon Emission Computed Tomography (SPECT), and the like.

Typically, an emission tomography imaging system must be calibrated. This is usually accomplished using a phantom. The phantom may for example simulate organs or other metabolic active sites of an animal or human body. In a combined MR (magnetic resonance) and emission tomography imaging system, the phantom used for the attenuation correction of an emission tomography subsystem may not be visible in a MR image.

SUMMARY

In at least one embodiment of the invention, an emission tomography subsystem in a combined MR, and emission tomography imaging system using a phantom, are calibrated.

In at least one embodiment, a method of calibrating an emission tomography subsystem in a combined MR (magnetic resonance) and/or emission tomography imaging system are disclosed.

By making parts of the phantom MR visible, the phantom is made detectable in a MR image. This enables identifying the position of the phantom in a MR image. The attenuation map usually comprises different attenuation values that depend on the specific composition, structure and orientation of the phantom. The attenuation map is mapped to the position of the phantom such that the predetermined attenuations of the attenuation map corresponding to the correct respective portions or areas of the phantom may be obtained. Mapping the attenuation map to the position of the phantom is accomplished using the position of the phantom obtained by the MR image.

When calibrating the emission tomography subsystem, the events detected by the emission tomography subsystem may be corrected using the attenuation map that has been registered to the position of the phantom. This allows correctly considering the attenuation induced by the phantom when calibrating the emission tomography subsystem.

This provides the advantage as the correct attenuation of the different portions or areas of the phantoms may be obtained so that the same may be considered while calibrating the emission tomography subsystem.

According to another embodiment, the phantom may be made MR visible by arranging a marker on the phantom, wherein the marker is MR visible. A marker may be arranged onto an existing phantom, the existing phantom itself not being MR visible, and thus, the phantom may be made MR visible.

According to yet another embodiment, the marker may be arranged substantially at the center of the phantom. Arranging the marker substantially at the center of the phantom may assists in having the marker positioned substantially at the center of the magnetic field. The magnetic field at the center is more uniform, and thus, provides increased accuracy of the position determined.

According to yet another embodiment, the marker may comprise a unique shape for uniquely identifying the phantom. The unique shape of the phantom enables in identifying the type of phantom.

According to yet another embodiment, the providing of the attenuation map may include providing a plurality of the attenuation maps corresponding to a plurality of different types of phantoms. The plurality of attenuation maps correspond to a plurality of different types of phantoms. This enables in having a single attenuation map for the same types of phantom. This enables using different phantoms for calibrating the system, making the calibration more flexible and precise.

According to yet another embodiment, the mapping of the attenuation map may include identifying the type of the phantom based on the MR image, and selecting the attenuation map from the plurality of attenuation maps based on the type of the phantom identified. Identifying the type of the phantom and then selecting the attenuation map based on the type of the phantom identified enables in selecting the attenuation map corresponding to the phantom.

According to yet another embodiment, the obtaining of the MR image of the phantom includes positioning the phantom such that the marker is positioned substantially at a center of a magnetic field of a MR scanner. Substantially at the center of the magnetic field is typically the homogeneity volume of the magnetic field. The homogeneity volume of the magnetic field is the area of the magnetic field with minimum distortions. This allows determining the position of the phantom from the MR image while minimizing the risk to not correctly identifying the position due to image distortion errors.

According to yet another embodiment, the position of the phantom is obtained based on a MR image pixel that corresponds substantially to a center of a homogeneity volume of a MR scanner. The MR image pixels corresponding substantially to the center of the homogeneity volume of the MR scanner are minimally distorted and thus provide increased accuracy of the position of the phantom. The distortion increases with the increase of the distance from the center of the homogeneity volume to the MR image pixel.

According to yet another embodiment, the obtaining of the position of the phantom includes performing a weighting operation on a MR image pixel to result into weighed pixel, wherein the weighting operation is a function of a distance from the center of a homogeneity volume of a MR scanner (15) to the MR image pixel. The weighting operation may ensure that the position of the phantom is determined substantially using pixels of portions with minimum distortion.

Another embodiment includes, a combined MR (magnetic resonance) and emission tomography imaging system according to claim 10.

By making the phantom MR visible the phantom is made visible in a MR image. This provides the advantage of identifying the position of the phantom in a MR image. The attenuation map is mapped to the position of the phantom such that the predetermined attenuations of the attenuation map corresponding to the correct respective portions or areas of the phantom may be obtained. This provides the advantage as the correct attenuation of the different portions or areas of the phantoms may be obtained so that the same may be considered while calibrating the PET subsystem.

BRIEF DESCRIPTION OF THE DRAWINGS

Embodiments of the present invention are further described hereinafter with reference to illustrated embodiments shown in the accompanying drawings, in which.

DETAILED DESCRIPTION OF THE EXAMPLE EMBODIMENTS

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

Various embodiments are described with reference to the drawings, wherein like reference numerals are used to refer to like elements throughout. In the following description, for purpose of explanation, numerous specific details are set forth in order to provide a thorough understanding of one or more embodiments. It may be evident that such embodiments may be practiced without these specific details.

Figure 1:
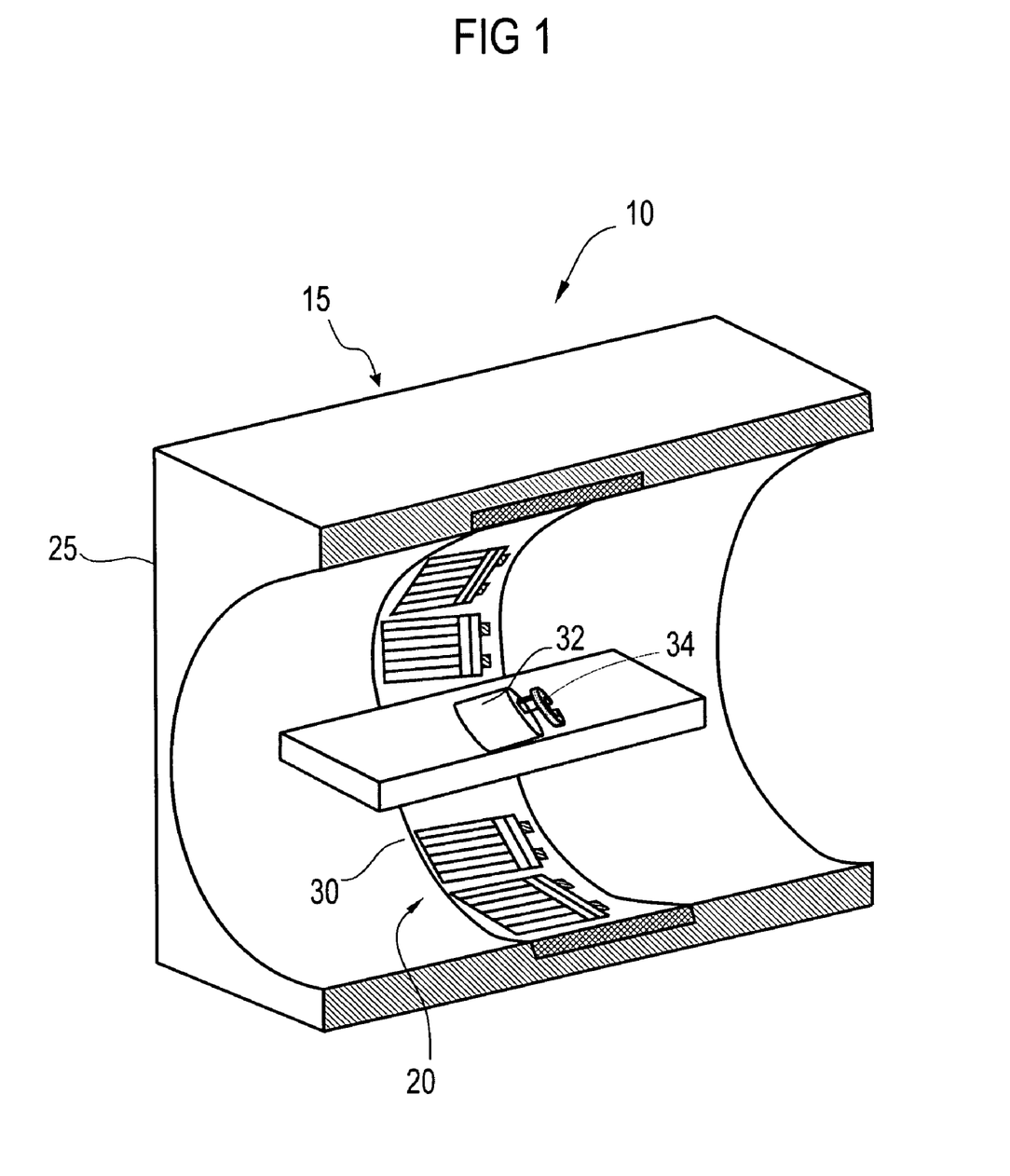
FIG. 1 illustrates an example of a combined MR and emission tomography imaging system according to an embodiment herein.

Referring to FIG. 1, a combined MR and emission tomography imaging system is illustrated according to an embodiment herein. The combined MR and emission tomography imaging system 10 comprises a MR scanner 15 and an emission tomography subsystem 20. The MR scanner 15 comprises a magnet system 25 for inducing a magnetic field for MR imaging. A ring 30 of the emission tomography subsystem 20 is disposed within the magnet system 25 of the MR scanner 15. For example, the ring 30 may be dimensioned such that the ring 30 may be positioned within the geometry of the MRI scanner 15. The ring 30 may comprise one or more detector modules to detect one or more photons. A subject to be imaged is positioned into the space defined by the MRI scanner 15 and the emission tomography subsystem 20.

In accordance with an embodiment of the invention, an attenuation of the emission tomography subsystem is calibrated using one or more phantoms 32. For example, different types of phantoms may be used and there may be multiple phantoms of the same type. The phantom 32 shown in the example of FIG. 1, is a schematic illustration of a phantom only for understanding purposes. In accordance with the present embodiment, the phantom 32 is configured such that the phantom is MR visible. For example, the phantom may be made MR visible by arranging a marker 34 on the phantom. The marker 34 may comprise a unique shape so that a type of the phantom 32 can be identified. Advantageously, the marker of multiple phantoms of the same type may comprise the same unique shape. This provides the advantage of having multiple phantoms of a single type.

Additionally, the MR visible marker 34 may enable in identifying the position of the phantom 32. Advantageously, to determine the position of the phantom 32 accurately, the phantom 32 may be positioned substantially at the center of the magnetic field induced by the magnet system 22. Thus, the phantom 32 may be positioned substantially at the center of a homogeneity volume of the magnetic field. The homogeneity volume of the magnetic field is the area of the magnetic field with minimum distortions. Positioning the phantom 32 substantially at the center of the magnetic field provides determination of the position of the phantom 32 with increased accuracy. However, if the phantom 32 is positioned off center, then the area of the MR image considered for determining the position of the phantom 32 may have to be restricted to areas with low distortions. In an alternative embodiment, the phantom 32 may be positioned such that the marker 34 is positioned substantially at the center of the of the homogeneity volume of the magnetic field induced by the magnet system 22.

Moreover, the visible marker 34 may also be arranged substantially at the center of the phantom 32. This may assist in having the phantom 32 positioned substantially at the center of the magnetic field and thus, provides increased accuracy of the position determined. However, the marker 34 may be arranged off center of the phantom 32 too. If the marker 34 is arranged off center, then the phantom 32 also may be positioned off center, such that, eventually the marker 34 of the phantom 32 is substantially at the center of the magnetic field. For example, the marker 34 could be arranged off center of the phantom 32 so that the marker 34 may be used for holding the phantom 32. Moreover, the phantom 32 may not comprise structures, such that the homogeneity of the magnetic field is distorted.

Figure 2:
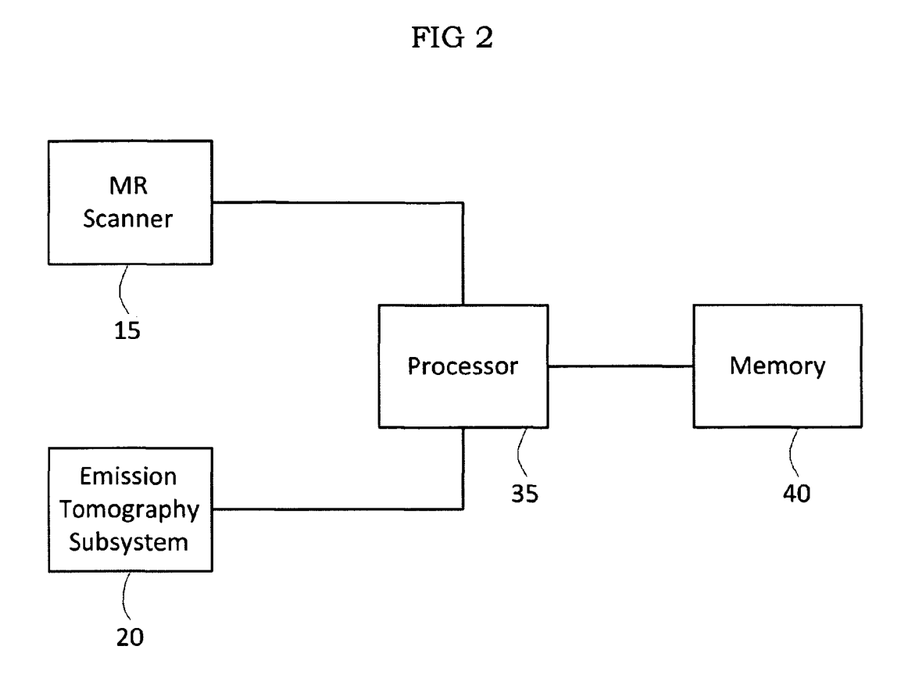
FIG. 2 illustrates a functional block diagram of a combined MR and emission tomography imaging system 10 according to an embodiment herein, FIG. 3 with reference to FIGS. 1 through 2 is a flow diagram illustrating a method of calibrating a combined MR and emission tomography imaging system.

FIG. 2 illustrates a functional block diagram of a combined MR and emission tomography imaging system 10 according to an embodiment herein. The MR scanner 15 and the emission tomography subsystem 20 are operatively coupled to a processor 35. The processor 35 is operatively coupled to a memory 40. The memory 40 may include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. For the calibration of the emission tomography subsystem 20, one or more attenuation maps may be provided to the imaging system 10. Typically, the attenuation maps may be stored at the memory 40 and may be retrieved by the processor 35 when desired. The attenuation maps, typically comprises predetermined attenuation values of the respective type of the phantoms 32 of FIG. 1. For example, for each type of a phantom 32 there may be a corresponding attenuation map.

Advantageously, a MR imaging sequence which minimizes distortion is used for the MR imaging, for example, a high readout bandwidth is used. The MR image detected by the MR scanner 15 is provided to the processor 35. In an embodiment, if the phantoms 32 are of only a single type, the processor 35 thereafter may determine the position of the marker 34 of FIG. 1 and thus, the position of the phantom 32.

If there are different types of phantoms 32, then the processor 35 may determine the position of the marker 34 and thus, the position of the phantom 32 and also identify the type of the phantom 32 from the unique shape of the visible marker 34.

Advantageously, the position of the phantom 32 is determined using the pixels substantially at the center of the MR image. Pixels substantially at the center of the MR image may enable determining the position of the phantom 32 more accurately, as the distortion at the center of the magnetic field is relatively less. Thus, if the phantom 32 is positioned substantially at the center of the magnetic field, pixels substantially at the center of the MR image may be used to determine the position of the phantom 32.

However, if the phantom 32 is positioned off center of the magnetic field, then it is advantageous to limit the MR image to be used for determining the position of the phantom 32 such that portions of the image with minimum distortions are only used. For example, according to an embodiment, portions of the MR image with minimum distortions may be identified and used by performing a weighting operation. The weighing operation may be of a first order function of a distance between the center of the magnetic field and the pixel. The weighting operation may ensure that the position of the phantom 32 is determined substantially using pixels of portions with minimum distortion.

Once the position of the phantom 32 is determined, the processor 35 may map the attenuation map with the position of the phantom 32 and thus, the emission tomography subsystem 20 may be calibrated.

The attenuation map is mapped to the position of the phantom 32 such that the predetermined attenuation values of the attenuation map corresponding to the correct respective portions or areas of the phantom 32 may be obtained. This provides the advantage as the correct attenuation of the different portions or areas of the phantoms 32 may be obtained so that the same may be considered while calibrating the emission tomography subsystem 20. Thereafter, the emission tomography subsystem 20 may be calibrated accurately as the photons detected by the emission tomography subsystem 20 may be processed to undergo the respective attenuation. In an embodiment, in implementations comprising different types of phantoms 32, the respective attenuation map may be selected based on the identified type of phantom 32. Thereafter, the selected attenuation map is mapped with the position of the phantom 32 and the emission tomography subsystem 20 may be calibrated.

Figure 3:
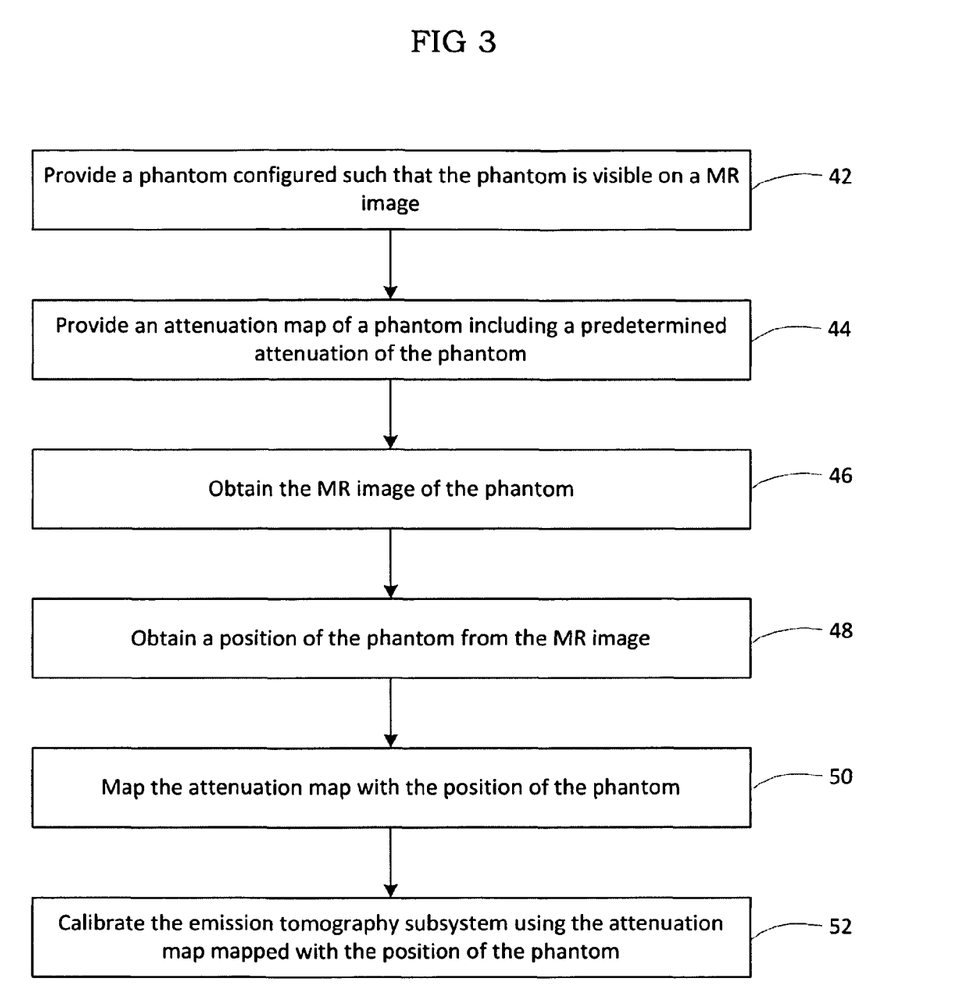

FIG. 3 with reference to FIGS. 1 through 2 is a flow diagram illustrating a method of calibrating a combined MR and emission tomography imaging system according to an embodiment herein. At block 42, a phantom 32 is provided that is configured such that the phantom 32 is visible on a MR image. Next at block 44, an attenuation map of a phantom 32 is provided, wherein the attenuation map comprises a predetermined attenuation of the phantom 32. Moving next to block 46, the MR image of the phantom 32 is obtained. Next at block 48, a position of the phantom 32 is obtained from the MR image. At block 50, the attenuation map is mapped with the position of the phantom 32. Next at block 52, the emission tomography subsystem 20 is calibrated using the attenuation map mapped with the position of the phantom 32.

The embodiments herein can take the form of an entirely hardware embodiment, an entirely software embodiment or an embodiment including both hardware and software elements. The embodiments that are implemented in software include but are not limited to, firmware, resident software, microcode, etc.

Furthermore, the embodiments herein can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 4:
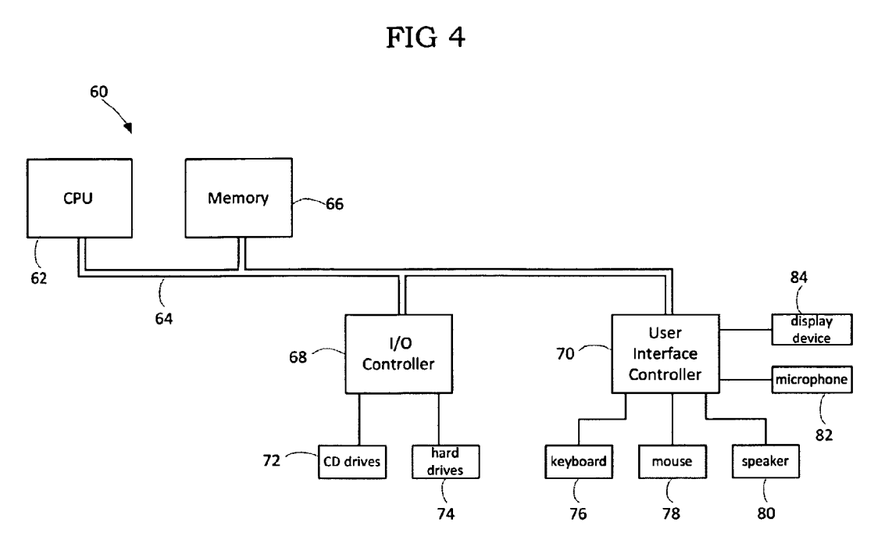
FIG. 4 depicts a representative hardware environment for practicing the embodiments described herein.

FIG. 4 depicts a representative hardware environment for practicing the embodiments described herein. This schematic drawing illustrates a hardware configuration of an information handling/computer system 60 in accordance with the embodiments herein. The system 60 comprises at least one processor or central processing unit (CPU) 62. The CPU 62 is interconnected via bus 64 to various devices such as a memory 66, input/output (I/O) controller 68, and user interface controller 70. Depending on the type and configuration of the system 60, the memory 66 may be volatile (such as random access memory (RAM) etc., non-volatile (read only memory (ROM), flash memory devices etc.,) or a combination of the two. The memory 66 is used to store instructions and data for use by the CPU 62. The I/O controller 68 can connect to peripheral devices, such as CD drives 72 and hard drives 74, or other program storage devices that are readable by the system. Typically, an operating system for the computer system 60 as well as an application program is stored onto the hard drive 74. The operating system runs on the CPU 62 and is used to coordinate and provide control of various components within system 60. The system 60 can read the inventive instructions on the hard drive 74 and load them onto the memory 66 for execution by the CPU 62. The user interface controller 70 can connect to a keyboard 76, mouse 78, speaker 80, microphone 82, display device 84 and/or other user interface devices such as a touch screen device (not shown) to the bus 64 to gather user input and also to provide system output to the user.

The embodiments described herein enable calibrating an emission tomography subsystem in a combined MR and emission tomography imaging system. Moreover, higher accuracies of calibration may be achieved using the embodiments described herein as the calibration is done using substantially the portions of the MR image having minimum distortion. Additionally, as the attenuation map is mapped with the position of the phantom, the calibration is more accurate as the correct attenuation of the different portions or areas of the phantoms are obtained so that the same may be considered while calibrating the PET subsystem.

While this invention has been described in detail with reference to certain preferred embodiments, it should be appreciated that the present invention is not limited to those precise embodiments. Rather, in view of the present disclosure which describes the current best mode for practicing the invention, many modifications and variations would present themselves, to those of skill in the art without departing from the scope and spirit of this invention. The scope of the invention is, therefore, indicated by the following claims rather than by the foregoing description. All changes, modifications, and variations coming within the meaning and range of equivalency of the claims are to be considered within their scope.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combinable features, lead to a new subject matter or to new method steps or sequences of method steps, including insofar as they concern production, testing and operating methods.

MOW References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program, computer readable medium and computer program product. For example, of the aforementioned methods may be embodied in the form of a system or device, including, but not limited to, any of the structure for performing the methodology illustrated in the drawings.

The computer readable medium or storage medium may be a built-in medium installed inside a computer device main body or a removable medium arranged so that it can be separated from the computer device main body. Examples of the built-in medium include, but are not limited to, rewriteable non-volatile memories, such as ROMs and flash memories, and hard disks. Examples of the removable medium include, but are not limited to, optical storage media such as CD-ROMs and DVDs; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method of calibrating an emission tomography subsystem in a combined MR (magnetic resonance) and emission tomography imaging system, the method comprising:
   providing a phantom that is configured such that the phantom is visible on a MR image;
   providing an attenuation map of the phantom, wherein the attenuation map includes an attenuation of the phantom;
   obtaining the MR image of the phantom;
   obtaining a position of the phantom from the MR image;
   mapping the attenuation map with the position of the phantom; and
   calibrating the emission tomography subsystem using the attenuation map mapped with the position of the phantom.

2. The method according to claim 1, wherein the phantom is made MR visible by arranging a marker on the phantom, and wherein the marker is MR visible.

3. The method according to claim 2, wherein the marker is arranged substantially at a center of the phantom.

4. The method according to claim 2, wherein the marker comprises a unique shape for uniquely identifying the phantom.

5. The method according to as claimed in claimed 1, wherein the providing of the attenuation map includes providing a plurality of the attenuation maps, corresponding to a plurality of different types of phantoms.

6. The method according to claim 5, wherein the mapping of the attenuation map includes:
   identifying the type of the phantom based on the MR image, and
   selecting the attenuation map from the plurality of attenuation maps based on the type of the phantom identified.

7. The method according to claim 1, wherein the obtaining of the MR image of the phantom includes positioning the phantom such that the marker is positioned substantially at a center of a magnetic field of a MR scanner.

8. The method according to claim 1, wherein the position of the phantom is obtained based on a MR image pixel that corresponds substantially to a center of a homogeneity volume of a MR scanner.

9. The method according to claim 1, wherein the obtaining of the position of the phantom includes performing a weighting operation on a MR image pixel to result into weighed pixel, and wherein the weighting operation is a function of a distance from the center of a homogeneity volume of a MR scanner to the MR image pixel.

10. A combined MR (magnetic resonance) and emission tomography imaging system, comprising:
    a phantom, wherein the phantom is MR visible;
    a memory for storing an attenuation map of the phantom, wherein the attenuation map includes an attenuation of the phantom;
    an MR scanner to obtain an MR image of the phantom; and
    a processor adapted to:
        obtain a position of the phantom from the MR image,
        map the attenuation map with the position of the phantom, and
        calibrate an emission tomography subsystem using the attenuation map mapped with the position of the phantom.

11. The combined MR and emission tomography imaging system according to claim 10, wherein the phantom is made MR visible by arranging a marker on the phantom, and wherein the marker is MR visible.

12. The combined MR and emission tomography imaging system according to claim 11, wherein the marker is arranged substantially at a center of the phantom.

13. The combined MR and emission tomography imaging system according to claim 11, wherein the marker comprises a unique shape for uniquely identifying the phantom.

14. The combined MR and emission tomography imaging system according to claim 10, wherein the memory is adapted to store a plurality of attenuations maps, corresponding to a plurality of different types of phantoms, the plurality of attenuation maps comprising the attenuation map.

15. The combined MR and emission tomography imaging system according to claim 14, wherein the processor is adapted to:
    identify the type of the phantom based on the MR image, and
    select the attenuation map from the plurality of attenuation maps based on the type of the phantom identified.

16. The combined MR and emission tomography imaging system according to claim 10, wherein the processor is adapted to obtain the position of the phantom based on a MR image pixel that corresponds substantially to a center of a homogeneity volume of a MR scanner.

17. The combined MR and emission tomography imaging system according to claim 10, wherein the processor is adapted to perform a weighting operation on a MR image pixel to result into a weighed pixel, wherein the weighting operation is a function of a distance from the center of a homogeneity volume of a MR scanner to the MR image pixel.

18. The method according to claim 3, wherein the marker comprises a unique shape for uniquely identifying the phantom.

19. The combined MR and emission tomography imaging system according to claim 12, wherein the marker comprises a unique shape for uniquely identifying the phantom.

* * * * *

UNITED STATES PATENT AND TRADEMARK OFFICE
CERTIFICATE OF CORRECTION

PATENT NO.         : 8,242,777 B2
APPLICATION NO.    : 12/585871
DATED              : August 14, 2012
INVENTOR(S)        : Ralf Ladebeck et al.

It is certified that error appears in the above-identified patent and that said Letters Patent is hereby corrected as shown below:

ON THE TITLE PAGE:

Item (73)    Assignee: should read,    Siemens Aktiengesellschaft, Munich (DE); Siemens Medical Solutions

USA, INC., Malvern, PA (US)

Signed and Sealed this
First Day of January, 2013

David J. Kappos
*Director of the United States Patent and Trademark Office*